US012702074B2

(12) United States Patent
Lu et al.

(10) Patent No.: US 12,702,074 B2
(45) Date of Patent: Aug. 4, 2026

(54) LIGHT-EMITTING DIODE LIGHT SOURCE HAVING HIGH LUMINOUS EFFICIENCY

(71) Applicant: Xiamen PVTECH Co., Ltd., Xiamen (CN)

(72) Inventors: Fuxing Lu, Xiamen (CN); Zhirong Lin, Xiamen (CN)

(73) Assignee: Xiamen PVTECH Co., Ltd., Xiamen (CN)

( * ) Notice: Subject to any disclaimer, the term of this patent is extended or adjusted under 35 U.S.C. 154(b) by 359 days.

(21) Appl. No.: 18/527,395

(22) Filed: Dec. 4, 2023

(65) Prior Publication Data

US 2025/0006710 A1    Jan. 2, 2025

(30) Foreign Application Priority Data

Jun. 29, 2023    (CN) .......................... 202310781293.0

(51) Int. Cl.
*H10W 90/00*        (2026.01)
*H10H 20/857*       (2025.01)

(52) U.S. Cl.
CPC .......... *H10W 90/00* (2026.01); *H10H 20/857* (2025.01)

(58) Field of Classification Search
CPC ... H10W 90/00; H10H 20/857; H10H 29/857; H10H 29/24; H10H 20/85; H10H 20/858; H01L 25/0753
See application file for complete search history.

(56) References Cited

U.S. PATENT DOCUMENTS

| | | | |
|---|---|---|---|
| 10,971,058 B1 * | 4/2021 | Cheng ...................... | G09G 3/32 |
| 11,996,497 B2 * | 5/2024 | Lee ..................... | H10H 20/8316 |
| 2019/0013298 A1 * | 1/2019 | Lai ......................... | H10W 90/00 |
| 2021/0083154 A1 * | 3/2021 | Maeda ................. | H10H 20/854 |
| 2021/0359167 A1 * | 11/2021 | Lee ..................... | H10H 20/8316 |
| 2022/0085243 A1 * | 3/2022 | Chang .................. | H10H 20/831 |
| 2022/0406760 A1 * | 12/2022 | Ogawa ................. | H10W 90/00 |
| 2023/0066918 A1 * | 3/2023 | Im ......................... | H10H 20/857 |
| 2023/0275102 A1 * | 8/2023 | Yin ......................... | H10D 86/60 |
| | | | 257/72 |

FOREIGN PATENT DOCUMENTS

| | | |
|---|---|---|
| CN | 209119166 U | 7/2019 |
| CN | 219017693 U | 5/2023 |

* cited by examiner

*Primary Examiner* — Victor A Mandala
(74) *Attorney, Agent, or Firm* — Bruce Stone LLP; Joseph A. Bruce

(57)        ABSTRACT

A light-emitting diode (LED) light source having high luminous efficiency includes a substrate, a positive electrode pad, a negative electrode pad, a first LED chip and a second LED chip. The positive electrode pad is disposed on the substrate. The negative electrode pad is disposed on the substrate, and there is a groove formed between the negative electrode pad and the positive electrode pad. The first LED chip is disposed on the positive electrode pad, and electrically connected to the positive electrode pad and negative electrode pad. The second LED chip is disposed on the negative electrode pad, and electrically connected to the positive electrode pad and negative electrode pad. A portion of the first LED chip protrudes from the positive electrode pad and covers a portion of the groove.

10 Claims, 4 Drawing Sheets

LIGHT-EMITTING DIODE LIGHT SOURCE HAVING HIGH LUMINOUS EFFICIENCY

BACKGROUND OF THE INVENTION

1. Field of the Invention

The present invention relates to a light-emitting diode (LED) light source, in particular to a LED light source having high luminous efficiency.

2. Description of the Prior Art

The light-emitting diode (LED) chips of currently available LED light sources are usually disposed on the negative electrode pads of the substrates. If an LED light source has two or more LED chips of the same size, and these LED chips are all disposed on the negative electrode pad of the substrate of the LED light source, which may result in severe optical interference. The above optical interference will incur a significant reduction in the luminous efficiency of the LED light source and an inefficient utilization of the space of the substrate.

When an LED light source has one large LED chip and one small LED chip, the large LED chip is usually disposed on the negative electrode pad of the substrate of the LED light source, and the small LED chip is usually disposed on the positive electrode pad of the substrate of the LED light source. However, as the currents flowing through these two LED chips are different, the voltages of these LED chips are also different. Consequently, the heat generation of these two LED chips will be inconsistent, leading to an increased risk of damage to the LED light source and a significant reduction in the reliability of the LED light source.

China Patent Publication No.: CN112510026A and China Patent Publication No.: CN113725203A disclose the technologies related to LED light sources, but these technologies still cannot effectively solve the aforementioned problems.

SUMMARY OF THE INVENTION

One embodiment of the present invention provides a light-emitting diode (LED) light source having high luminous efficiency, which includes a substrate, a positive electrode pad, a negative electrode pad, a first LED chip and a second LED chip. The positive electrode pad is disposed on the substrate. The negative electrode pad is disposed on the substrate, and there is a groove formed between the negative electrode pad and the positive electrode pad. The first LED chip is disposed on the positive electrode pad, and electrically connected to the positive electrode pad and negative electrode pad. The second LED chip is disposed on the negative electrode pad, and electrically connected to the positive electrode pad and negative electrode pad. A portion of the first LED chip protrudes from the positive electrode pad and covers a portion of the groove.

In one embodiment, the first LED chip comprises a first part protruding from the positive electrode pad and a second part not protruding from the positive electrode pad. The width of the first part is 5% to 50% of the width of the groove.

In one embodiment, the first LED chip comprises a first part protruding from the positive electrode pad and a second part not protruding from the positive electrode pad. The width of the first part is 30% to 50% of the width of the groove.

In one embodiment, the first LED chip comprises a first part protruding from the positive electrode pad and a second part not protruding from the positive electrode pad. The width of the first part is 45% to 50% of the width of the groove.

In one embodiment, the first LED chip and the second LED chip are rectangular.

In one embodiment, the first LED chip is parallel to the second LED chip.

In one embodiment, the first LED chip is perpendicular to the second LED chip.

In one embodiment, the LED light source further includes a third LED chip disposed on the negative electrode pad. The LED chip is electrically connected to the positive electrode pad and the negative electrode pad.

In one embodiment, the third LED chip is rectangular.

In one embodiment, the second LED chip is parallel to the third LED chip. The second LED chip and the third LED chip are perpendicular to the first LED chip.

The LED light source having high luminous efficiency in accordance with the embodiments of the present invention may have the following advantages:

(1) In one embodiment of the present invention, the LED light source has a special cross-groove structure. As a result, a portion of the first LED chip disposed on the positive electrode pad can protrude from the positive electrode pad and cover a portion of the groove between the positive electrode pad and the negative electrode pad. In this way, the size of the first LED chip is not limited by the area of the positive electrode pad, such that the size of the first LED chip can be equal to that of the second LED chip disposed on the negative electrode pad. Consequently, the heat generation of the first and second LED chips will be consistent, so the service life of the first LED chip can approach that of the second LED chip. Therefore, this structural design enhances the stability and reliability of the LED light source.

(2) In one embodiment of the present invention, the LED light source has the special cross-groove structure, such that a portion of the first LED chip disposed on the positive electrode pad can protrude from the positive electrode pad while covering a portion of the groove between the positive and negative electrode pads. Consequently, the size of the first LED chip is not restricted by the area of the positive electrode pad. Accordingly, the negative electrode pad can accommodate two LED chips (the second and third LED chips) and the sizes of these LED chips can be effectively increased.

(3) In one embodiment of the present invention, the first LED chip can be disposed on the positive electrode pad, while the second LED chip can be disposed on the negative electrode pad, such that these LED chips can be evenly distributed between the positive and negative electrode pads. Additionally, a part of the first LED chip disposed on the positive electrode pad can protrude from the positive electrode pad. This structural design effectively enhances the heat dissipation of the LED light source so as to further improve the service life thereof.

(4) In one embodiment of the present invention, the LED light source features a special cross-groove structure that effectively reduces optical interference between the first LED chip and the second LED chip (and the third LED chip). Therefore, the luminous efficiency of the LED light source can be effectively increased. Consequently, the overall performance of the LED light source can be greatly enhanced.

(5) In one embodiment of the present invention, the design of the LED light source is simple, so the LED light source can achieve the desired technical effects without significantly increasing the cost thereof. Thus, the LED light source can be more comprehensive in application in order to meet actual requirements.

Further scope of applicability of the present application will become more apparent from the detailed description given hereinafter. However, it should be understood that the detailed description and specific examples, while indicating exemplary embodiments of the present invention, are given by way of illustration only, since various changes and modifications within the spirit and scope of the present invention will become apparent to those skilled in the art from this detailed description.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more fully understood from the detailed description given herein below and the accompanying drawings which are given by way of illustration only, and thus are not limitative of the present invention and wherein.

DETAILED DESCRIPTION

Figure 1:
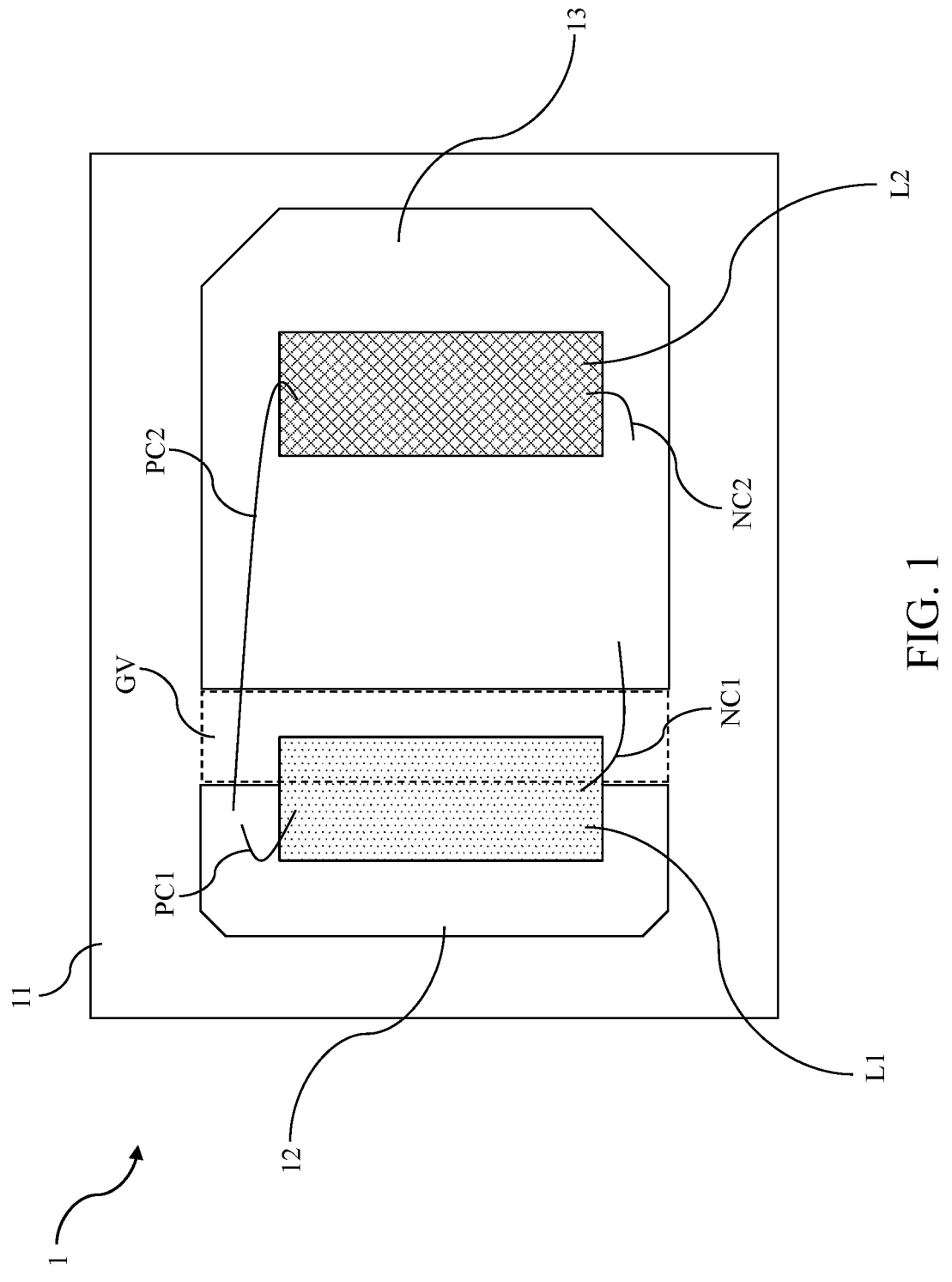
FIG. 1 is the top view of the light-emitting diode (LED) light source having high luminous efficiency in accordance with the first embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Please refer to FIG. 1, which is the top view of the light-emitting diode (LED) light source having high luminous efficiency in accordance with the first embodiment of the present invention. As shown in FIG. 1, the LED light source 1 includes a substrate 11, a positive electrode pad 12, a negative electrode pad 13, a first LED chip L1, and a second LED chip L2.

The positive electrode pad 12 and the negative electrode pad 13 are disposed on the substrate 11. A groove GV is formed between the negative electrode pad 13 and the positive electrode pad 12.

The first LED chip L1 is disposed on the positive electrode pad 12 and electrically connected to the positive electrode pad 12 and the negative electrode pad 13. Specifically, the first LED chip L1 is connected to the positive electrode pad 12 via the first positive electrode wire PC1 and connected to the negative electrode pad 13 via the first negative electrode wire NC1. In this embodiment, the first LED chip L1 is rectangular. In another embodiment, the first LED chip L1 may have other shapes, depending on practical requirements.

The second LED chip L2 is disposed on the negative electrode pad 13 and electrically connected to the positive electrode pad 12 and the negative electrode pad 13. The second LED chip L2 is connected to the positive electrode pad 12 via the second positive electrode wire PC2 and to the negative electrode pad 13 via the second negative electrode wire NC2. In this embodiment, the second LED chip L2 is rectangular. In another embodiment, the second LED chip L2 may have other shapes, depending on practical requirements. The first LED chip L1 and the second LED chip L2 are parallel to each other. In other words, the symmetry axis of the first LED chip L1 (parallel to the long side thereof) is parallel to the symmetry axis of the second LED chip L2 (parallel to the long side thereof).

The LED light source 1 has a special cross-groove structure. According to FIG. 1, a portion of the first LED chip L2 protrudes from the positive electrode pad 12 and covers a portion of the groove GV.

The embodiment just exemplifies the present invention and is not intended to limit the scope of the present invention; any equivalent modification and variation according to the spirit of the present invention is to be also included within the scope of the following claims and their equivalents.

Figure 2:
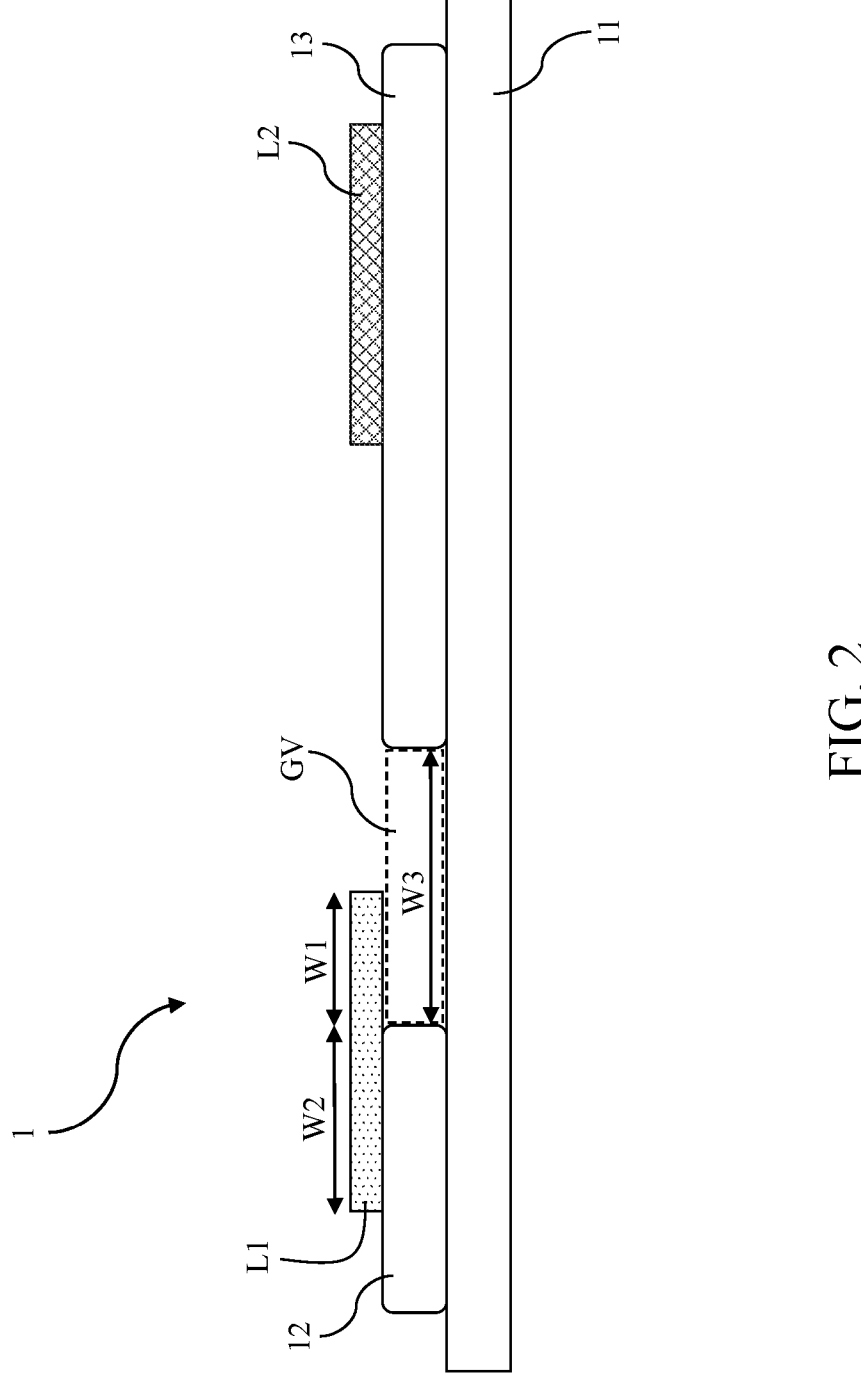
FIG. 2 is the side view of the LED light source having high luminous efficiency in accordance with the first embodiment of the present invention.

Please refer to FIG. 2, which is the side view of the LED light source having high luminous efficiency in accordance with the first embodiment of the present invention. As shown FIG. 2, the first LED chip L1 includes a first part and a second part. The first part protrudes from the positive electrode pad 12, while the second part does not protrude from the positive electrode pad 12.

The width of the first part of the first LED chip L1 is W1 and the width of the second part of the first LED chip L1 is W2. Additionally, the width of the groove GV is W3. The width W1 of the first part of the first LED chip L1 is 5% to 50% of the width W3 of the groove GV. Furthermore, the width W1 of the first part of the first LED chip L1 can also be 30% to 50% of the width W3 of the groove GV.

In this embodiment, the width W1 of the first part of the first LED chip L1 can also be 45% to 50% (close to 50%) of the width W3 of the groove GV. Additionally, the area covered by the first part of the first LED chip L1 is greater than $\frac{1}{3}$ of the total area of the groove GV but less than $\frac{1}{2}$ of the total area of the groove GV. The above structural design can effectively reduce optical interference between the first LED chip L1 and the second LED chip L2 with a view to significantly improving the luminous efficiency of the LED light source 1. Therefore, the overall performance of the LED light source 1 can be greatly improved.

As mentioned above, the LED light source 1 has a special cross-groove structure, so a portion (the first part) of the first LED chip L1 disposed on the positive electrode pad 12 can protrude from the positive electrode pad 12 and cover a portion of the groove GV between the positive electrode pad 12 and the negative electrode pad 13. In this way, the size of the first LED chip L1 is not limited by the area of the positive electrode pad 12, such that the size of the first LED chip L1 can be consistent with the size of the second LED chip L2 disposed on the negative electrode pad 13. As a result, the heat generation of the first LED chip L1 and the second LED chip L2 will also be consistent, and the service life of the first LED chip L1 can be close to the service life of the second LED chip L2. Therefore, the above structural design can make the service life of the LED light source 1 be more stable in order to enhance the reliability of the LED light source 1.

Furthermore, a portion of the first LED chip L1 can be disposed on the positive electrode pad 12, while the second LED chip L2 can be disposed on the negative electrode pad 13. In this way, these LED chips can be evenly distributed between the positive electrode pad 12 and the negative electrode pad 13. Additionally, a portion of the first LED chip L1 disposed on the positive electrode pad 12 can protrude from the positive electrode pad 12. The above structural design can effectively improve the heat dissipation efficiency of the LED light source 1 with a view to further extend the service life of the LED light source 1.

The embodiment just exemplifies the present invention and is not intended to limit the scope of the present invention; any equivalent modification and variation according to the spirit of the present invention is to be also included within the scope of the following claims and their equivalents.

Figure 3:
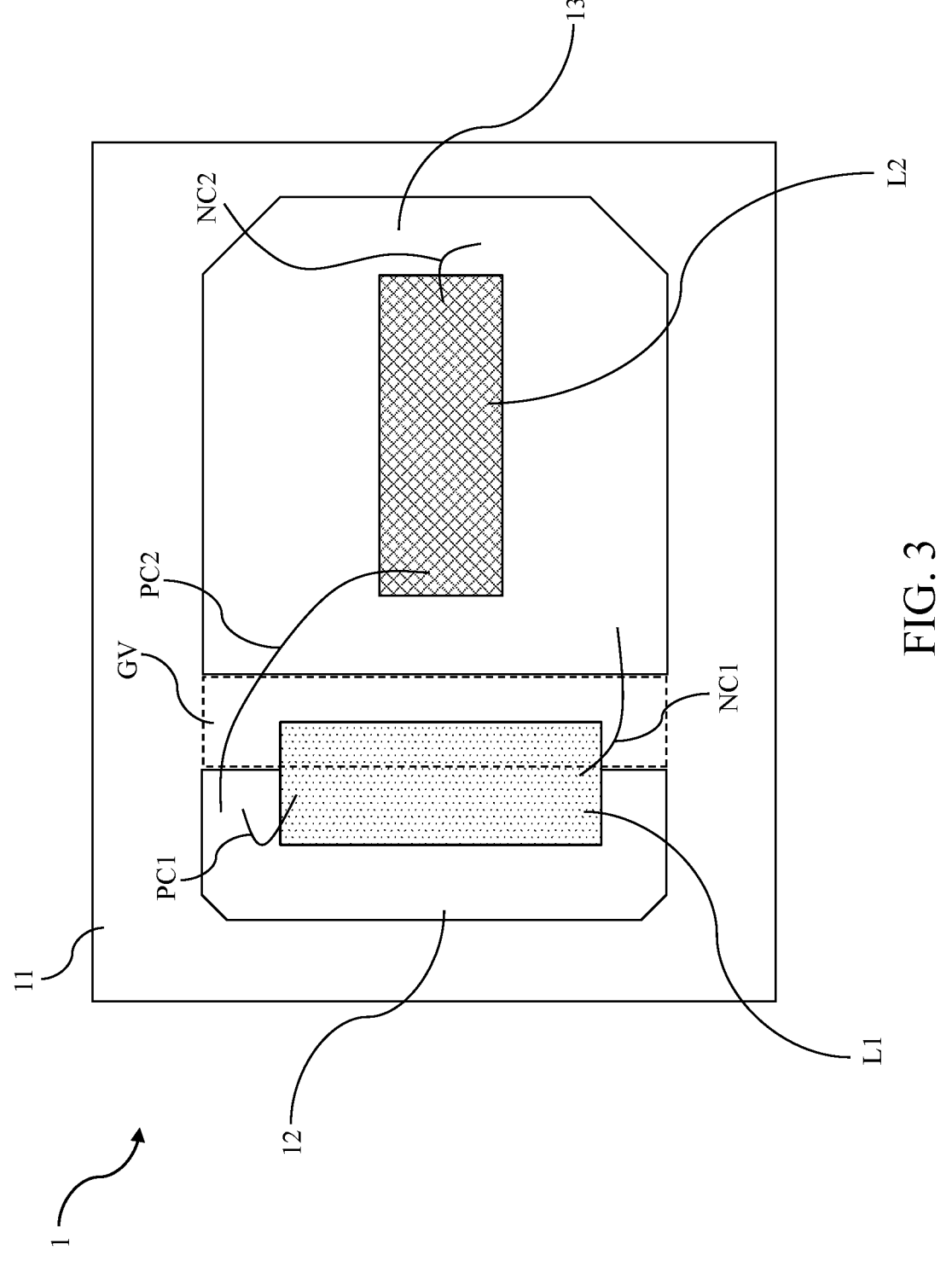
FIG. 3 is the top view of the LED light source having high luminous efficiency in accordance with the second embodiment of the present invention.

Please refer to FIG. 3, which is the top view of the LED light source having high luminous efficiency in accordance with the second embodiment of the present invention. As shown in FIG. 3, the LED light source 1 includes a substrate 11, a positive electrode pad 12, a negative electrode pad 13, a first LED chip L1, and a second LED chip L2.

The positive electrode pad 12 and the negative electrode pad 13 are disposed on the substrate 11. A groove GV is formed between the negative electrode pad 13 and the positive electrode pad 12.

The first LED chip L1 is disposed on the positive electrode pad 12 and is electrically connected to the positive electrode pad 12 and the negative electrode pad 13. In this embodiment, the first LED chip L1 is rectangular. In another embodiment, the first LED chip L1 can also have other shapes depending on practical requirements.

The second LED chip L2 is disposed on the negative electrode pad 13 and is electrically connected to the positive electrode pad 12 and the negative electrode pad 13. In this embodiment, the second LED chip L2 is rectangular. In another embodiment, the second LED chip L2 can have other shapes depending on practical requirements.

The difference between the embodiment and the previous embodiment is that the first LED chip L1 and the second LED chip L2 are perpendicular to each other in the embodiment. In other words, the symmetry axis of the first LED chip L1 (parallel to the long side thereof) is perpendicular to the symmetry axis of the second LED chip L2 (parallel to the long side thereof).

Similarly, the above structural design can also make the service life of the LED light source 1 more stable so as to enhance the reliability of the LED light source 1. Furthermore, the above structural design can effectively reduce optical interference between the first LED chip L1 and the second LED chip L2 so as to effectively improve the luminous efficiency of the LED light source 1. Therefore, the overall performance of the LED light source 1 can be greatly improved.

The embodiment just exemplifies the present invention and is not intended to limit the scope of the present invention; any equivalent modification and variation according to the spirit of the present invention is to be also included within the scope of the following claims and their equivalents.

It is worthy to point out that the LED chips of a currently available LEDC light source are all disposed on the negative electrode pad of the substrate of the LED light source, which may result in severe optical interference. The above optical interference will incur a significant reduction in the luminous efficiency of the LED light source and an inefficient utilization of the space of the substrate. If an LED light source has one large LED chip and one small LED chip, the large LED chip is usually disposed on the negative electrode pad of the substrate of the LED light source, and the small LED chip is usually disposed on the positive electrode pad of the substrate of the LED light source. However, as the currents flowing through these two LED chips are different, the voltages of these LED chips are also different. Consequently, the heat generation of these two LED chips will be inconsistent, leading to an increased risk of damage to the LED light source and a significant reduction in the reliability of the LED light source. On the contrary, according to one embodiment of the present invention, the LED light source has a special cross-groove structure. As a result, a portion of the first LED chip disposed on the positive electrode pad can protrude from the positive electrode pad and cover a portion of the groove between the positive electrode pad and the negative electrode pad. In this way, the size of the first LED chip is not limited by the area of the positive electrode pad, such that the size of the first LED chip can be equal to that of the second LED chip disposed on the negative electrode pad. Consequently, the heat generation of the first and second LED chips will be consistent, so the service life of the first LED chip can approach that of the second LED chip. Therefore, this structural design enhances the stability and reliability of the LED light source.

Also, according to one embodiment of the present invention, the LED light source has the special cross-groove structure, such that a portion of the first LED chip disposed on the positive electrode pad can protrude from the positive electrode pad while covering a portion of the groove between the positive and negative electrode pads. Consequently, the size of the first LED chip is not restricted by the area of the positive electrode pad. Accordingly, the negative electrode pad can accommodate two LED chips (the second and third LED chips) and the sizes of these LED chips can be effectively increased.

Further, according to one embodiment of the present invention, the first LED chip can be disposed on the positive electrode pad, while the second LED chip can be disposed on the negative electrode pad, such that these LED chips can be evenly distributed between the positive and negative electrode pads. Additionally, a part of the first LED chip disposed on the positive electrode pad can protrude from the positive electrode pad. This structural design effectively enhances the heat dissipation of the LED light source so as to further improve the service life thereof.

Moreover, according to one embodiment of the present invention, the LED light source features a special cross-groove structure that effectively reduces optical interference between the first LED chip and the second LED chip (and the third LED chip). Therefore, the luminous efficiency of the LED light source can be effectively increased. Consequently, the overall performance of the LED light source can be greatly enhanced.

Furthermore, according to one embodiment of the present invention, the design of the LED light source is simple, so the LED light source can achieve the desired technical effects without significantly increasing the cost thereof. Thus, the LED light source can be more comprehensive in application in order to meet actual requirements. As set forth above, the LED light source according to the embodiments of the preset invention can definitely achieve great technical effects.

Figure 4:
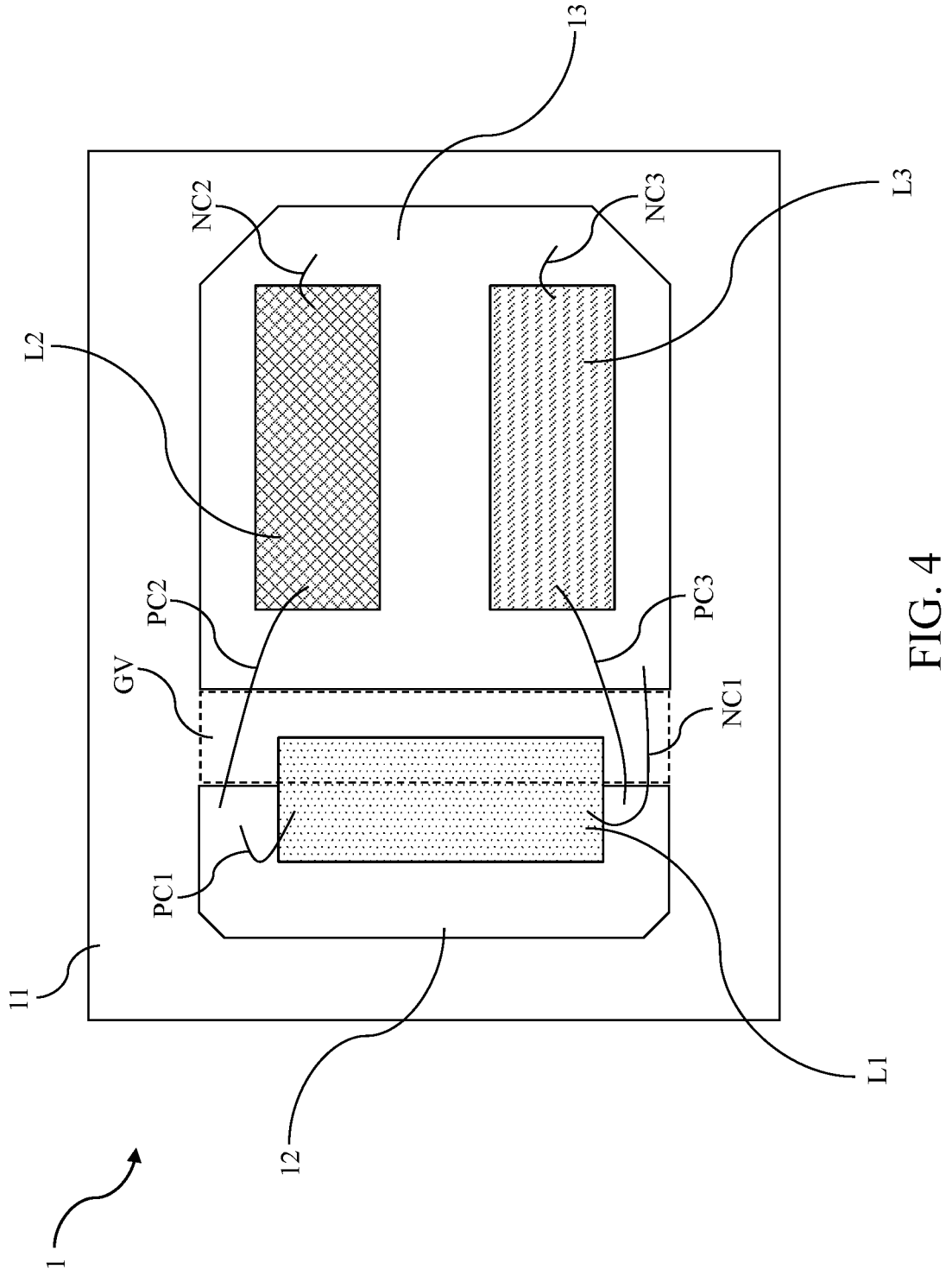
FIG. 4 is the top view of the LED light source having high luminous efficiency in accordance with the third embodiment of the present invention.

Please refer to FIG. 4, which is the top view of the LED light source having high luminous efficiency in accordance with the third embodiment of the present invention. As shown in FIG. 4, the LED light source 1 includes a substrate 11, a positive electrode pad 12, a negative electrode pad 13, a first LED chip L1 and a second LED chip L2.

The difference between the embodiment and the previous embodiment is that the LED light source 1 of the embodiment further includes a third LED chip L3.

The positive electrode pad 12 and the negative electrode pad 13 are disposed on the substrate 11. A groove GV is formed between the negative electrode pad 13 and the positive electrode pad 12.

The first LED chip L1 is disposed on the positive electrode pad 12, and is electrically connected to the positive electrode pad 12 and the negative electrode pad 13. In this embodiment, the first LED chip L1 is rectangular. In another embodiment, the first LED chip L1 can also have other shapes depending on practical requirements.

The second LED chip L2 is disposed on the negative electrode pad 13 and is electrically connected to the positive electrode pad 12 and the negative electrode pad 13. In this embodiment, the second LED chip L2 is rectangular. In another embodiment, the second LED chip L2 can have other shapes depending on practical requirements.

The third LED chip L3 is disposed on the negative electrode pad 13, and is electrically connected to the positive electrode pad 12 and the negative electrode pad 13. In this embodiment, the third LED chip L3 is rectangular. In another embodiment, the third LED chip L3 can have other shapes depending on practical requirements.

In this embodiment, the second LED chip L2 is parallel to the third LED chip L3, while the second LED chip L2 and the third LED chip L3 are perpendicular to the first LED chip L1. In other words, the symmetry axis of the second LED chip L2 (parallel to the long side thereof) and the symmetry axis of the third LED chip L3 (parallel to the long side thereof) are parallel to each other. The symmetry axis of the second LED chip L2 (parallel to the long side thereof) and the symmetry axis of the third LED chip L3 (parallel to the long side thereof) are perpendicular to the symmetry axis of the first LED chip L1 (parallel to the long side thereof).

The LED light source 1 has a special cross-groove structure. According to FIG. 4, a portion of the first LED chip L2 protrudes from the positive electrode pad 12 and covers a portion of the groove GV. In this way, the size of the first LED chip L1 is not limited by the area of the positive electrode pad 12. Therefore, the negative electrode pad 13 can accommodate the second LED chip L2 and the third LED chip L3, so the sizes of these LED chips can be effectively increased.

Furthermore, the above cross-groove structure can effectively reduce optical interference between the first LED chip L1, the second LED chip L2 and the third LED chip L3 so as to effectively improve the luminous efficiency of the LED light source 1. Therefore, the overall performance of the LED light source 1 can be greatly improved.

Additionally, the heat generated by the first LED chip L1, the second LED chip L2 and the third LED chip L3 will be consistent. Therefore, the service lives of the first LED chip L1, the second LED chip L2, and the third LED chip L3 can be close to each other. Accordingly, the above structural design can make the service life of the LED light source 1 more stable with a view to enhancing the reliability of the LED light source 1.

The embodiment just exemplifies the present invention and is not intended to limit the scope of the present invention; any equivalent modification and variation according to the spirit of the present invention is to be also included within the scope of the following claims and their equivalents.

To sum up, according to one embodiment of the present invention, the LED light source has a special cross-groove structure. As a result, a portion of the first LED chip disposed on the positive electrode pad can protrude from the positive electrode pad and cover a portion of the groove between the positive electrode pad and the negative electrode pad. In this way, the size of the first LED chip is not limited by the area of the positive electrode pad, such that the size of the first LED chip can be equal to that of the second LED chip disposed on the negative electrode pad. Consequently, the heat generation of the first and second LED chips will be consistent, so the service life of the first LED chip can approach that of the second LED chip. Therefore, this structural design enhances the stability and reliability of the LED light source.

Also, according to one embodiment of the present invention, the LED light source has the special cross-groove structure, such that a portion of the first LED chip disposed on the positive electrode pad can protrude from the positive electrode pad while covering a portion of the groove between the positive and negative electrode pads. Consequently, the size of the first LED chip is not restricted by the area of the positive electrode pad. Accordingly, the negative electrode pad can accommodate two LED chips (the second and third LED chips) and the sizes of these LED chips can be effectively increased.

Further, according to one embodiment of the present invention, the first LED chip can be disposed on the positive electrode pad, while the second LED chip can be disposed on the negative electrode pad, such that these LED chips can be evenly distributed between the positive and negative electrode pads. Additionally, a part of the first LED chip disposed on the positive electrode pad can protrude from the positive electrode pad. This structural design effectively enhances the heat dissipation of the LED light source so as to further improve the service life thereof.

Moreover, according to one embodiment of the present invention, the LED light source features a special cross-groove structure that effectively reduces optical interference between the first LED chip and the second LED chip (and the third LED chip). Therefore, the luminous efficiency of the LED light source can be effectively increased. Consequently, the overall performance of the LED light source can be greatly enhanced.

Furthermore, according to one embodiment of the present invention, the design of the LED light source is simple, so the LED light source can achieve the desired technical effects without significantly increasing the cost thereof. Thus, the LED light source can be more comprehensive in application in order to meet actual requirements.

It will be apparent to those skilled in the art that various modifications and variations can be made to the disclosed embodiments. It is intended that the specification and examples be considered as exemplary only, with a true scope of the present invention being indicated by the following claims and their equivalents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting diode (LED) light source, comprising:
a substrate;
a positive electrode pad disposed on the substrate;
a negative electrode pad disposed on the substrate, wherein there is a groove formed between the negative electrode pad and the positive electrode pad;
a first LED chip disposed on the positive electrode pad, and electrically connected to the positive electrode pad and negative electrode pad; and
a second LED chip disposed on the negative electrode pad, and electrically connected to the positive electrode pad and negative electrode pad;
wherein a portion of the first LED chip protrudes from the positive electrode pad and covers a portion of the groove, and wherein the portion, protruding from the positive electrode pad, of the first LED chip does not contact the negative electrode pad, and is suspended over the groove.

2. The LED light source as claimed in claim 1, wherein the first LED chip comprises a first part protruding from the positive electrode pad and a second part not protruding from the positive electrode pad, and a width of the first part is 5% to 50% of a width of the groove.

3. The LED light source as claimed in claim 1, wherein the first LED chip comprises a first part protruding from the positive electrode pad and a second part not protruding from the positive electrode pad, and a width of the first part is 30% to 50% of a width of the groove.

4. The LED light source as claimed in claim 1, wherein the first LED chip comprises a first part protruding from the positive electrode pad and a second part not protruding from the positive electrode pad, and a width of the first part is 45% to 50% of a width of the groove.

5. The LED light source as claimed in claim 1, wherein the first LED chip and the second LED chip are rectangular.

6. The LED light source as claimed in claim 5, wherein the first LED chip is parallel to the second LED chip.

7. The LED light source as claimed in claim 5, wherein the first LED chip is perpendicular to the second LED chip.

8. The LED light source as claimed in claim 5, further comprising a third LED chip disposed on the negative electrode pad, and electrically connected to the positive electrode pad and the negative electrode pad.

9. The LED light source as claimed in claim 8, wherein the third LED chip is rectangular.

10. The LED light source as claimed in claim 9, wherein the second LED chip is parallel to the third LED chip, and the second LED chip and the third LED chip are perpendicular to the first LED chip.

* * * * *